(12) United States Patent
Matsumoto et al.

(10) Patent No.: US 7,206,898 B2
(45) Date of Patent: Apr. 17, 2007

(54) CONTENT-ADDRESSABLE MEMORY ADAPTABLE TO VARIOUS APPARATUSES AND SYSTEMS HAVING DIFFERENT CONFIGURATIONS

(75) Inventors: Kimihito Matsumoto, Kawasaki (JP); Takashi Iino, Kawasaki (JP); Yasunori Terasaki, Kawasaki (JP); Daisuke Namihira, Kawasaki (JP); Ken Aoyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 10/695,852

(22) Filed: Oct. 29, 2003

(65) Prior Publication Data
US 2004/0085834 A1    May 6, 2004

(30) Foreign Application Priority Data
Oct. 30, 2002    (JP) .............................. 2002-316453

(51) Int. Cl.
*G06F 12/00*    (2006.01)
(52) U.S. Cl. .......................... 711/108; 711/202; 365/49
(58) Field of Classification Search ................ 711/108, 711/170, 202; 365/200, 49
See application file for complete search history.

(56) References Cited

U.S. PATENT DOCUMENTS 5,339,268 A * 8/1994 Machida ...................... 365/49
6,226,710 B1 * 5/2001 Melchior ..................... 711/108
6,560,670 B1 * 5/2003 Ichiriu ........................ 711/108

FOREIGN PATENT DOCUMENTS

| JP | 2001-236790 | 8/2001 |
|---|---|---|
| JP | 2002-217896 | 8/2002 |

\* cited by examiner

*Primary Examiner*—Pierre-Michel Bataille
(74) *Attorney, Agent, or Firm*—Katten Muchin Rosenman LLP

(57) ABSTRACT

The invention relates to a content-addressable memory. An object of the invention is to make the content-addressable memory adaptable to various apparatuses and systems having different configurations without substantially altering the basic configuration thereof. The content-addressable memory includes a storage section having a plurality of storage areas for storing respective plural pieces of information; an ancillary storage section having a plurality of ancillary storage areas that correspond to the plurality of storage areas and store priority ranks that are assigned to the respective plurality of storage areas; and a controlling section for outputting, when at least one of the storage areas stores therein information matching with an externally supplied word, pointers of all or part of the at least one of the storage areas in descending order of priority ranks that are stored in ancillary storage areas corresponding to the at least one of storage areas.

14 Claims, 5 Drawing Sheets

FIG. 3

| PRIORITY RANK | CODE | ITEM |
|---|---|---|

| CODE | ITEM |
|---|---|
| 0 0 0 1 | REFERENCE FOR COMPARISON |
| 0 0 1 0 | NUMBER OF ASSOCIATIVE ADDRESSES TO BE OUTPUT |
| 0 0 1 1 | COMBINATION OF ASSOCIATIVE ADDRESSES TO BE OUTPUT |
| 0 1 0 0 | FORM OF ASSOCIATIVE ADDRESSES TO BE OUTPUT |
| 0 1 0 1 | CONTENTS OF ASSOCIATIVE ADDRESSES TO BE OUTPUT |
| 0 1 1 1 | PROCEDURE OF PROCESSING |
| 1 0 0 0 | OPERATION SUBJECT REFERRED IN PROCESSING |
| ⋮ | ⋮ |

(a)

(b)

(c)

CONTENT-ADDRESSABLE MEMORY ADAPTABLE TO VARIOUS APPARATUSES AND SYSTEMS HAVING DIFFERENT CONFIGURATIONS

CROSS REFERENCE TO RELATED APPLICATION

This application is based upon and claims the benefit of priority from Japanese Patent Application No. 2002-316453, filed Oct. 30, 2002, the entire contents of which are incorporated herein by reference.

BACKGROUND OF THE INVENTION

1. Field of the Invention

The present invention relates to a content-addressable memory that has storage areas each storing therein information and outputs an address (pointer) of a storage area storing therein information matching with information input from exterior.

2. Description of the Related Art

The CAM (content-addressable memory) is a memory device for searching, at high speed, for information having certain correlation with externally input information by means of hardware, and it has recently been incorporated in not only routers that perform packet routing and filtering but also Layer-4 switches that distribute requests (connection requests) from clients in Layer-4.

FIG. 5 shows the configuration of a conventional CAM. As shown in FIG. 5, a 1-bit enable signal S, data D having a prescribed word length, an address A, an instruction I, a search key K, and a control signal I/D are input to an enable terminal Sin, a data input Din, an address input Ain, an instruction input Iin, a search key input Kin, and a control terminal I/Din of a decoder 50, respectively. N decoding outputs SETout-1 to SETout-N (for the sake of simplicity, it is assumed that N is equal to 2 n where n is the word length (number of bits) of the address A) of the decoder 50 are connected to corresponding selection inputs of entry blocks 60-1 to 60-N, respectively.

An N-bit search key output Kout, an N-bit data output Dout, a search output Sout, an insert output INSout, a delete output DELout of the decoder 50 are connected to corresponding inputs of each of the entry blocks 60-1 to 60-N respectively.

The entry block 60-1 is provided with the following components:

An information storage part 61-1 that stores information as a search subject (hereinafter given a symbol "D-1" to indicate the relation with the entry block 60-1) and a binary validity bit V-1 indicating whether valid information D-1 as a search subject is held in the information storage part 61-1.

An AND gate 62-1 with its one input connected to one of the outputs of the information storage part 61-1 and its other input connected to the search output Sout, the one of the outputs corresponding to an output corresponding to the validity bit V-1 described above.

A comparator 63-1 (final stage of the entry block 60-1) that has an enable terminal being connected to the output of the AND gate 62-1 and that is connected to the described search key output Kout and to an output of the information storage part 61-1 corresponding to the information D-1 described above.

The entry blocks 60-2 to 60-N have the same configuration as the entry block 60-1. The components of the entry blocks 60-2 to 60-N will be referred to by using the same reference symbols as the corresponding components of the entry block 60-1 except that the former will be given suffixes "2" to "N" though they are not shown in FIG. 5, and the description on them will be omitted.

The outputs of the comparators 63-1 to 63-N in the entry blocks 60-1 to 60-N are connected to corresponding inputs of a priority encoder 70 which outputs an associative address.

In the CAM having the above configuration, all the contents of the information storage parts 61-1 to 61-N are initialized when an apparatus incorporating the CAM is started. In the following description, it is assumed that the logical value of each of the validity bits V-1 to V-N is set to "1" only during a period when valid information is stored in its corresponding storage area.

Pieces of information D-1 to D-N are registered in the information storage parts 61-1 to 61-N in the following manner. Note that In the following description an item common to the information storage parts 61-1 to 61-N will be given a suffix "C" meaning that it may be any of suffixes "1" to "N".

The decoder 50 performs the following processings in a period when an instruction I meaning "writing"(="insert") is supplied externally:

Decodes an address A-C that is input together with the instruction I, and selects only a single entry block 60-C corresponding to the address A-C from the entry blocks 60-1 to 60-N.

Writes, to the information storage part 61-C, a validity bit V-C having a logical value "1" and information D-C supplied from exterior, in synchronism with a control signal I/D indicating an instance at which data is written and being supplied along with the instruction I and the address A-C at an instant when a setup time of the information D-C and a priority rank P-C has been secured.

For deletion of valid information D-C written to the information storage part 61-C for example, the information D-C is nullified in the following manner.

The decoder 50 performs the following processings in a period when an instruction I meaning "deletion"(="delete") is supplied externally:

Decodes an address A-C that is input together with the instruction I, and selects only a single entry block 60-C corresponding to the address A-C from the entry blocks 60-1 to 60-N.

Sets the logical value of the validity bit V-C registered in the information storage part 61-C to "0", in synchronism with a control signal I/D that is supplied at an instant when a setup time for the instruction I and the address A-C has been secured.

An address (associative address) of a storage area storing the same information as an externally supplied search key K, for example, is searched from the storage areas of the information storage parts 61-1 to 61-N in the following manner.

In a period when an instruction I meaning "search" (="search") is supplied externally, the decoder 50 supplies all the entry blocks 60-1 to 60-N with a search key K that is input externally in parallel with the instruction I.

In the entry block 60-C, the AND gate 62-C allows the comparator 63-C to operate only during a period when the instruction I (=search) is supplied and the logical value of the validity bit V-C stored in the information storage part 61-C is equal to "1".

During this period, the comparator 63-C EXCLUSIVE-ORs between the information D-C stored in the information storage part 61-C together with the validity bit V-C (="1") and the search key K supplied from the decoder 50, and outputs binary information indicating whether all the bits of the EXCLUSIVE-OR result have a logical value "0" (for the sake of simplicity, it is assumed that its logical value is set to "1" only when the judgment result is "true").

Among pieces of binary information having a logical value "1" and outputted in parallel from the comparators 63-1 to 63-N (i.e., entry blocks 60-1 to 60-N), the priority encoder 70 preferentially decodes a piece of binary information that is output from a comparator with the smallest suffix number, thereby outputting, as an associative address, a unique address that is given to a single storage area (one of the storage areas of the information storage parts 61-1 to 61-N) where the same information as the search key K is stored (e.g., refer to Japanese Unexamined Patent Publication Application Nos. Hei11-102589 (paragraphs 0003–0010) and 2001-236790).

In the meantime, in a case where the above conventional example is applied to filtering or routing of a router or the like, the same information as a search key K is often stored in a plurality of ones of the storage areas in the information storage parts 61-1 to 61-N.

In an Layer-3 switch, however, a port number, an IP address and a MAC address are input as a search key K and given priority in this input order, and a flow control may be performed according to a combination of part of the port number, the IP address, and the MAC address. Therefore, one or both of the IP address and the MAC address, when not included in the combination, are generally excluded from a subject of comparison with the contents of the information storage part 61-C according to a predetermined mask pattern.

That is, in such an Layer-3 switch, in the case where all combinations of the above kind are registered in the respective information storage parts 61-1 to 61-N, it is probable that a plurality of entries match with a search key K (hereinafter referred to as "multiple hit") during a searching process (described above).

Therefore, a normal flow control is not always performed unless pairs of information as a subject of comparison and a mask pattern are registered in the information storage parts 61-1 to 61-N in proper order in which the above-mentioned priority order is attained.

For assuring such order, the larger the number N of the entry blocks 60-1 to 60-N and the number of flows to be controlled in parallel, the more complexing the managing of the permutation of pieces of information to be registered in the entry blocks 60-1 to 60-N. This means that enormous amount of processings is required for obtaining a proper permutation, and furthermore, it is likely that the higher the frequency at which the proper permutation is obtained, the lower the service quality and the transmission quality. Further, the more various the forms of a QoS (quality of service) control that is performed during the course of a flow control (described above), the higher the frequency, and the frequency also increases as the QoS control is done under load distribution.

A multiple hit (mentioned above) may also occur not only in the Layer-3 switch but also in an Layer-4 switch or Layer-7 switch, for example. The Layer-4 switch distributes packets and other requests issued from clients to proper servers according to the contents of headers that comply with a transport layer and the Layer-7 switch realizes contents distribution based on layered URL referencing, a transparent caching function, fail over, etc.

SUMMARY OF THE INVENTION

An object of the present invention is to provide a content-addressable memory of the invention adaptable to various apparatuses and systems having different configurations without altering its basic configuration to a large extent.

Another object of the invention is to enable the content-addressable memory to adapt to a variety of apparatuses and systems without imposing any limitations on pieces of information stored in a plurality of storage areas of a storage section and on order in which they are individually stored therein.

Another object of the invention is to reduce the number of wiring and pins used for receiving priority ranks from the exterior and to determine the layout and mounting of individual parts freely.

Still another object of the invention is to make the content-addressable memory be more adaptable to a variety of functions and specifications of a system or an apparatus that will incorporate the content-addressable memory.

Another object of the invention is to enable the content-addressable memory to adapt to a variety of functions and specifications of a system or an apparatus that will incorporate the content-addressable memory, and to standardize the configurations thereof in compliance with these functions and specifications.

Another object of the invention is to make the content-addressable memory be more adaptable to a variety of functions and specifications of an apparatus or a system that will incorporate the content-addressable memory, and to enhance the added values thereof.

Yet another object of the invention is to enable the content-addressable memory according to the invention to be mounted more freely in an apparatus or a system.

Another object of the invention is to simplify the configuration of the content-addressable memory without lowering its performance.

Another object of the invention is to realize use of various kinds of information and priority ranks irrespective of a value of the total word length of information and priority ranks.

Another object of the invention is to achieve flexible adaptation of the content-addressable memory to the functions and specifications of an apparatus or a system that will include the content-addressable memory, and the enhancement of the added values thereof.

A further object of the invention is to enable an apparatus or a system to which the invention is applied to be more adaptable to a variety of configurations, and to improve its total reliability and performance.

A first content-addressable memory according to the invention includes a plurality of ancillary storage areas that correspond to a plurality of storage areas, respectively. The plurality of ancillary storage areas store therein priority ranks that are assigned to the respective plurality of storage areas. The first content-addressable memory outputs, when at least one of the storage areas stores therein information matching with a word supplied from an exterior, pointers of all or part of the at least one of the storage areas in descending order of priority ranks that are stored in ancillary storage areas corresponding to the at least one of the storage areas.

In this content-addressable memory, even if plural pieces of information stored in the storage section match with an externally supplied word, it is able to output pointers of all or part of storage areas where the plural pieces of information are stored, in the order of priority ranks stored in their corresponding ancillary storage areas.

In a second content-addressable memory according to the invention, sequential priority ranks are created in order in which plural pieces of information are stored in the plurality of storage areas, and the created priority ranks are stored in their corresponding ancillary storage areas, respectively.

In this content-addressable memory, priority ranks are stored in the respective plurality of ancillary storage areas and set to unique values in the order of the storing even in a case where they are not supplied from the exterior unlike the plural pieces of information.

In a third content-addressable memory according to the invention, the plural pieces of information are supplied in serial from the exterior and stored in the plurality of storage areas sequentially.

It is possible to simplify a pin assignment and an interface with the exterior as long as this content-addressable memory has a desired responsibility, compared to a case that pieces of information are supplied in parallel.

In a fourth content-addressable memory according to the invention, priority ranks assigned to the respective plurality of storage areas are supplied in a serial manner and stored in the plurality of ancillary storage areas sequentially.

It is possible to simplify a pin assignment and an interface with the exterior as long as this content-addressable memory has a desired responsibility, compared to a case that priority ranks are supplied in parallel.

A fifth content-addressable memory according to the invention has a section for converting the priority ranks stored in the plurality of ancillary storage areas into unique priority ranks indicating an order in which the plural pieces of information stored in the plurality of storage areas match with a common word supplied from the exterior.

In this content-addressable memory, the stored priority ranks need not be unique because they are converted into unique priority ranks that comply with functions or specifications of a system or an apparatus that is provided with the content-addressable memory according to the invention.

In a sixth content-addressable memory according to the invention, each of the stored priority ranks contains ancillary control information indicating a relation that is to be satisfied between information stored in the plurality of storage areas and pointers of the storage areas. The stored priority ranks are converted into priority ranks which satisfy the relation indicated by the ancillary control information.

In this content-addressable memory, the stored priority ranks can be converted into proper values as long as they comply with functions and specifications of a system or an apparatus that will incorporate the content-addressable memory, even in a case where the functions and specifications are various in forms or they are modified.

In a seventh content-addressable memory according to the invention, the plurality of storage areas and the plurality of ancillary storage areas are configured as a set of common storage areas in each of which a single piece of information and a priority rank that correspond to each other are stored in a pack.

In this content-addressable memory, each storage area and its corresponding ancillary storage area store therein information and a priority rank collectively as long as they are set together and supplied in parallel.

In an eighth content-addressable memory according to the invention, each of the common storage areas is configured as a set of a plurality of partial storage areas to which data is written individually.

In this content-addressable memory, the storage area and ancillary storage area stores therein with sureness the above-mentioned information and priority rank as an array of a plurality of words, even in the case where the total word length of the information and the priority rank exceeds a maximum word length of words that can be written in parallel.

In a ninth content-addressable memory according to the invention, control information is appended to each of the priority ranks stored in the plurality of ancillary storage areas. The control information indicates a processing to be done. When information stored in one of the storage areas matches with a word supplied from the exterior, a processing indicated by control information, which is stored in an ancillary storage area corresponding to the one of the storage areas, is performed.

In this content-addressable memory, a subject and a procedure of such processing can be set or updated when necessary in accordance with control information that is appended to a priority rank stored in each ancillary storage.

In a tenth content-addressable memory according to the invention, the control information contains all or part of the number pointers to be output, a pointer type, and a criterion which is for judging whether the stored information in the plurality of storage areas match with the externally supplied word.

In this content-addressable memory, a pointer of one of the storage areas, which stores therein information that matches with a word supplied from the exterior, is obtainable in various different ways in accordance with control information.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3 shows a form of a control word that is appended to a priority rank;

DESCRIPTION OF THE PREFERRED EMBODIMENTS

First, the principles of content-addressable memories according to the present invention will be hereinafter described.

Figure 1:
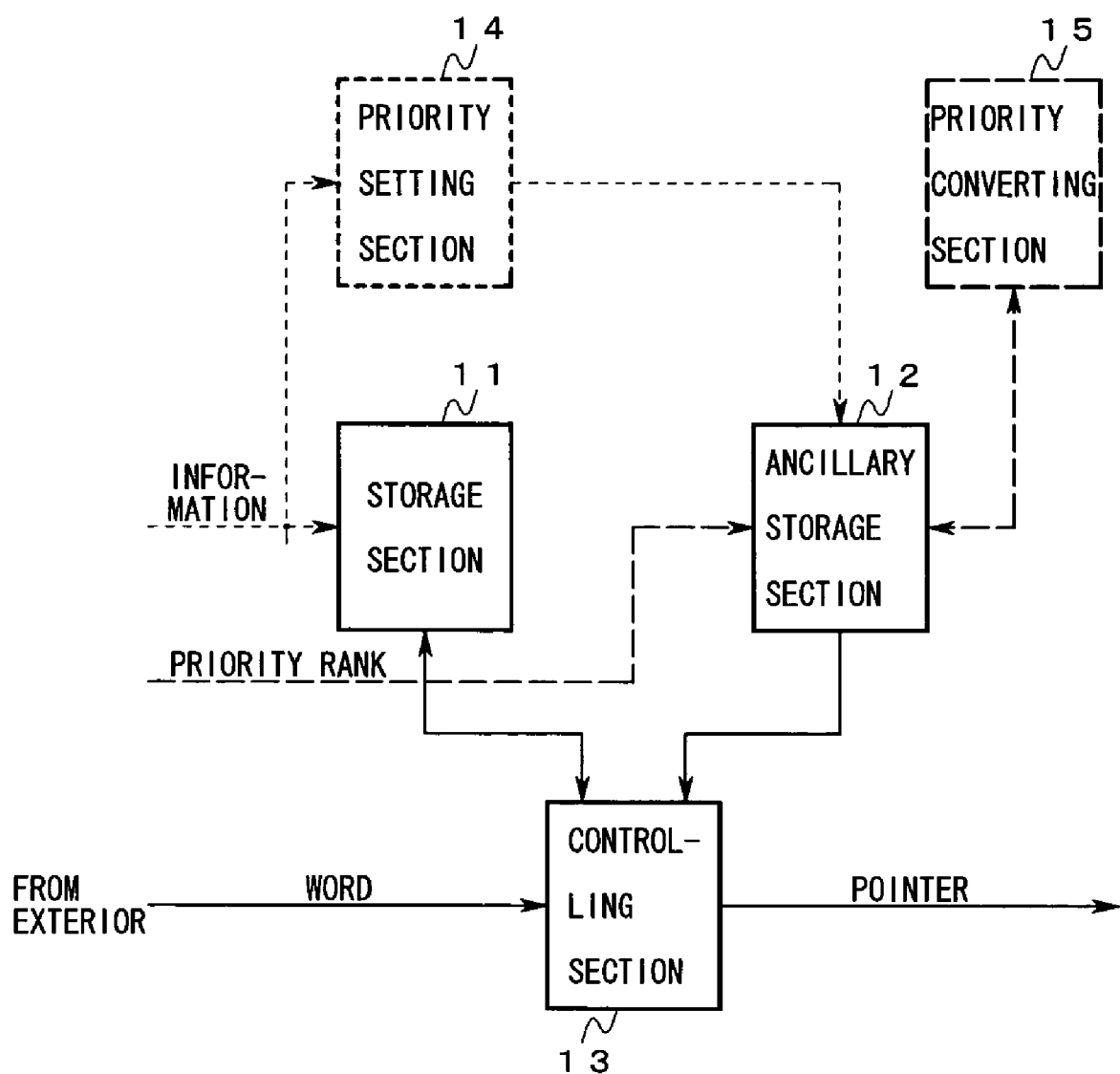
FIG. 1 is a block diagram showing the principles of the present invention.

FIG. 1 is a block diagram showing the principles of the invention. Each of the content-addressable memories shown in FIG. 1 is composed of all or part of a storage section 11, an ancillary storage section 12, a controlling section 13, a priority setting section 14, and a priority converting section 15.

In a first content-addressable memory according to the invention, the storage section 11 has a plurality of storage areas for storing respective plural pieces of information. The ancillary storage section 12 has a plurality of ancillary storage areas that correspond to the plurality of storage areas and store priority ranks that are assigned to the respective plurality of storage areas. The controlling section 13 outputs, when at least one of the storage areas stores therein information matching with a word supplied from exterior, pointer(s) of all or part of the at least one of the storage in descending order of priority ranks that are stored in ancillary storage area(s) corresponding to the at least one of the storage areas.

In this content-addressable memory, even if plural pieces of information of the stored information in the storage section 11 match with an externally supplied word, it is possible to output pointers of all or part of storage areas storing the plural pieces of information in the order of priority ranks that are stored in their corresponding ancillary storage areas.

This makes the content-addressable memory be adaptable to a variety of apparatuses and systems without imposing any limitations on information to be stored in the plurality of storage areas of the storage section 11 or an order in which the information is stored therein.

In a second content-addressable memory according to the invention, a priority setting section 14 creates sequential priority ranks in order in which the plural pieces of information are stored in the plurality of storage areas, and stores the created priority ranks in ancillary storage areas corresponding to the storage areas, respectively.

In this content-addressable memory, the priority ranks can be set to unique values in order in which the plural pieces of information are stored in the respective plurality of storage areas even if the priority ranks are not supplied from exterior unlike the plural pieces of information.

This makes it possible to reduce the number of wiring and pins that are used for receiving priority ranks from the exterior without impairing its performance and to decide the layout and mounting of individual parts freely, unless any limitation is imposed on the order in which pieces of information are written to the plurality of storage areas.

In a third content-addressable memory according to the invention, the storage section 11 is supplied with the plural pieces of information from the exterior in a serial manner, and the supplied pieces of information are stored in the plurality of storage areas sequentially.

With a desired secure responsibility of the content-addressable memory, a pin assignment therein and an interface with the outside can be simplified, compared with a case that pieces of information are supplied in parallel. This enables the mounting of parts into an apparatus or a system provided with the content-addressable memory according to the invention to be done more freely.

In a fourth content-addressable memory according to the invention, the ancillary storage section 12 is supplied with priority ranks from exterior in a serial manner, the priority ranks being assigned to the respective plurality of storage areas, and stores the priority ranks in the plurality of ancillary storage areas sequentially.

With a desired secure responsibility of the content-addressable memory, a pin assignment therein and an interface with the outside can be simplified, compared with a case that the priority ranks are supplied in parallel. This enables the mounting of parts into an apparatus or a system provided with the content-addressable memory of the invention to be done more freely.

In a fifth content-addressable memory according to the invention, the priority converting section 15 converts each of the stored priority ranks stored in the respective plurality of ancillary storage areas into unique priority ranks indicating an order in which the plural pieces of information stored in the plurality of storage areas are to match a common word supplied from exterior.

In other words, each of the stored priority ranks does not have to be unique since they are converted into unique priority ranks that comply with functions or specifications of a system or an apparatus that is provided with the content-addressable memory according to the invention. This makes this content-addressable memory be more adaptable to a variety of functions and specifications of the above-mentioned system or apparatus.

In a sixth content-addressable memory according to the invention, each of the priority ranks stored in the plurality of ancillary storage areas contains ancillary control information indicating a condition to be satisfied between information stored in the plurality of storage areas and pointers of the storage areas. The priority converting section 15 converts each of the stored priority ranks into a priority rank satisfying the condition indicated by the ancillary control information.

In this content-addressable memory, each of the stored priority ranks in the respective ancillary storage areas are converted into proper values as long as the content-addressable memory of the invention complies with functions and specifications of a system or an apparatus which will incorporate the content-addressable memory, even if the functions and specifications are in a variety of forms or they are modified. This makes the content-addressable memory be more adaptable to the variety of functions and specifications, and also realizes the standardization of configurations thereof.

In a seventh content-addressable memory according to the invention, the plurality of storage areas and the plurality of ancillary storage areas are configured as a set of common storage areas in each of which a single piece of information and a priority rank associated with each other are stored in a pack.

In this content-addressable memory, the information and priority rank are stored collectively in each of the storage areas and its corresponding ancillary storage area as long as they are determined together and are supplied in parallel. This can simplify the configuration of the content-addressable memory without degrading its performance.

In an eighth content-addressable memory according to the invention, each of the common storage areas is configured as a set of partial storage areas to which data is written individually.

In this content-addressable memory, the information and priority ranks are surely stored as an array of words in the storage areas and ancillary storage areas, respectively, even if the total word length of the information and the priority ranks exceeds a maximum word length of words that can be written in parallel. Accordingly, various kinds of information and a variety of priority ranks are usable as long as data is written to/read from the storage areas and the ancillary storage areas, irrespective of a value of the above total word length.

In a ninth content-addressable memory according to the invention, control information is appended to each of the priority ranks stored in the plurality of ancillary storage areas. The control information indicates a processing which the controlling section 13 is to perform. The controlling section 13 determined which one of the ancillary storage areas corresponds to a storage area which stores therein information matching with the word supplied from the exterior, and performs a processing indicated from control information which is stored in the determined ancillary storage area.

That is, an object and a procedure of such processing can be set or updated when necessary in accordance with control information appended to priority ranks that are stored in the ancillary storage areas. This makes the content-addressable memory be adaptable to functions and specifications of an apparatus or a system which will incorporate the content-addressable memory, and thereby enhances its added values.

In a 10th content-addressable memory according to the invention, the control information contains all or part of the number of pointers to be output, a pointer type, and a criterion for judging whether the plural pieces of information stored in the plurality of storage areas match with a word supplied from the exterior.

In this content-addressable memory, various pointers of storage areas storing therein information matching with an externally supplied word are obtainable in accordance with the control information. This realizes a content-addressable memory adaptable to functions and specifications of an apparatus or a system which will incorporate the content-addressable memory, and thereby enhances its added values.

Embodiments of the invention will be hereinafter described in detail with reference to the drawings.

Figure 2:
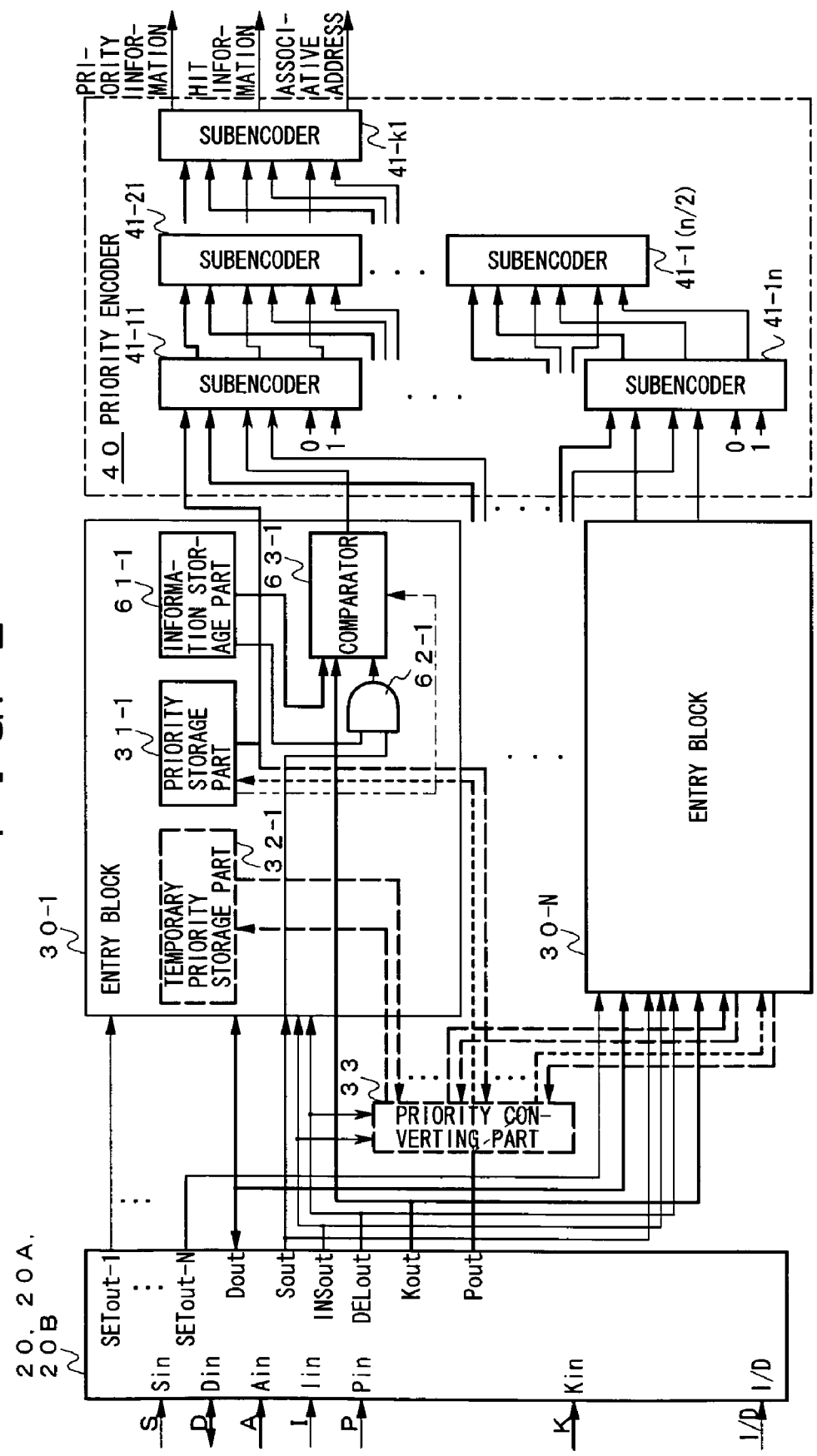
FIG. 2 is a block diagram showing first to fifth embodiments according to the invention.

FIG. 2 is a block diagram showing first to fifth embodiments according to the invention.

Figure 5:
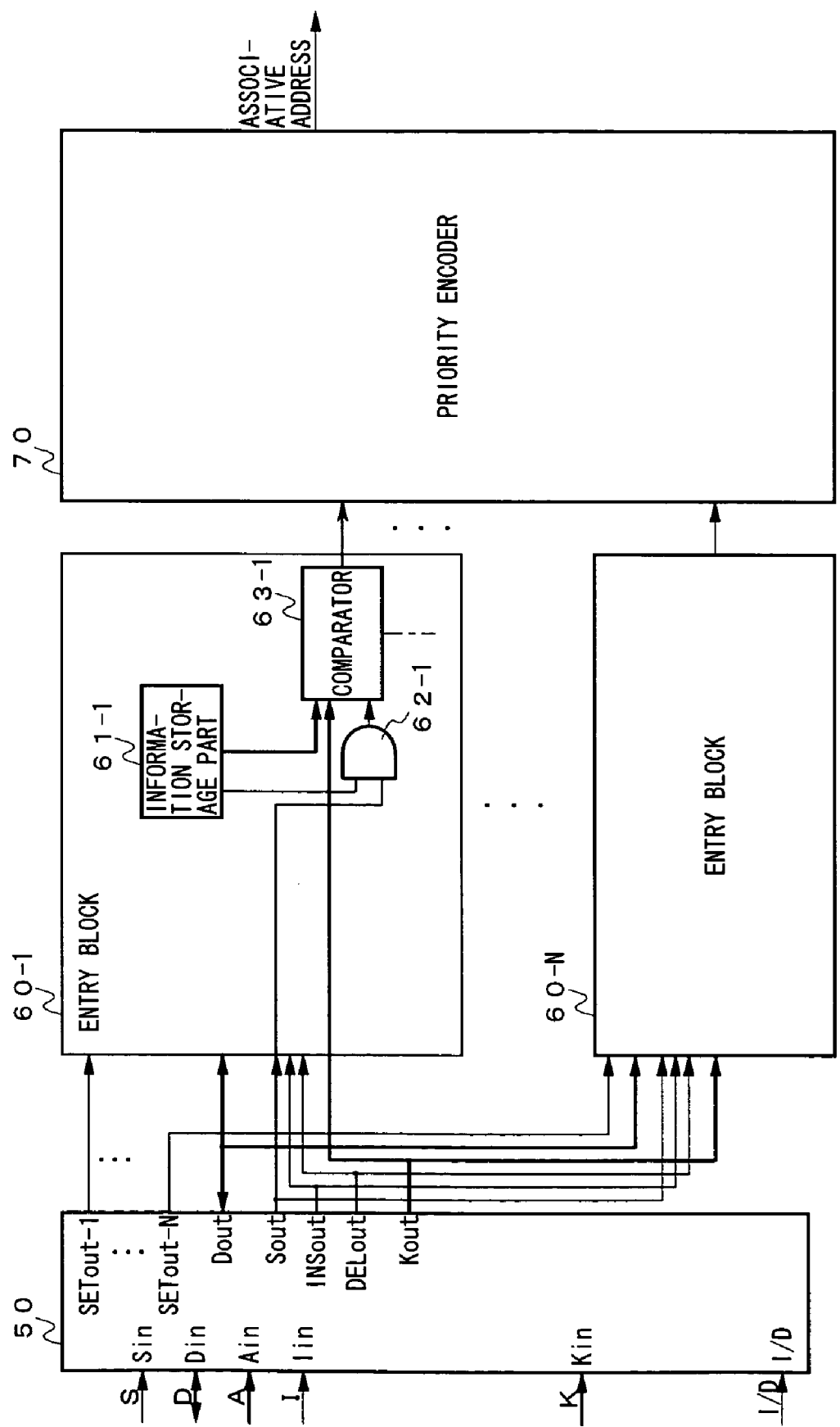
FIG. 5 shows the configuration of a conventional CAM.

In a first embodiment according to the invention, a decoder 20, entry blocks 30-1 to 30-N, and a priority encoder 40 are provided in place of the decoder 50, the entry blocks 60-1 to 60-N, and the priority encoder 70, respectively, that are shown in FIG. 5.

The decoder 20 has a priority input Pin supplied with a priority rank P externally and a priority output Pout connected to corresponding inputs of the entry blocks 30-1 to 30-N not via a priority converting part (described later).

The entry block 30-1 is provided with a priority storage part 31-1 that has a write port that is connected to the priority output Pout, and whose output is connected to a corresponding input of the priority encoder 40.

The entry blocks 30-2 to 30-N have the same configuration as the entry block 30-1. The components of the entry blocks 30-2 to 30-N will be referred to by using the same reference symbols as the corresponding components of the entry block 30-1 except that the former will be given suffixes "2" to "N" though they are not shown in FIG. 2, and they will not be described in detail.

The priority encoder 40 is structured as a set of subencoders 41-11 to 41-1n, 41-21 to 41-2(n/2), . . . , 41-k1 each of which is given a first suffix (one of "1" to "k") indicating a stage number (one of the first stage to the last stage) and a second suffix that is a natural number being smaller than or equal to n that is a half of the total number N of the entry blocks 30-1 to 30-N.

(a) The subencoders 41-11 to 41-1n have the following inputs and outputs:

First comparison result inputs that are connected, in ascending order of suffixes of the comparators, to the outputs of the comparators, the outputs being ones with odd suffix numbers of the symbol "63" among the outputs of the comparators 63-1 to 63-N.

Second comparison result inputs that are connected to the outputs of the comparators whose suffixes of the symbol "63" are even numbers that are equal to the above-mentioned odd numbers plus one, respectively.

First priority inputs that are connected to the outputs of the priority storage parts whose suffixes of the symbol "31" are odd numbers among the outputs of the priority storage parts 31-1 to 31-N, in ascending order of the suffixes.

Second priority inputs that are connected to the outputs of the priority storage parts with even suffix numbers of the symbol "31" that are the above-mentioned odd numbers plus one, respectively.

First cascade inputs and second cascade inputs that are given fixed logical values "0" and "1", respectively.

Comparison result outputs each used for transmitting binary information at one of the first or second comparison result input to the subsequent stage.

Priority outputs each used for transmitting a priority rank at one of the first or second priority input to the subsequent stage.

Cascade outputs each used for transmitting one of the logical values at the first and second cascade inputs and an internally packed additional bit to the subsequent stage.

(b) The subencoders 41-21 to 41-2(n/2), . . . , 41-k1 (k=log2n+1) are provided downstream of the subencoders 41-11 to 41-1n so as to be halved in number stage by stage.

Each of the subencoders 41-21 to 41-2(n/2), . . . , 41-k1 is connected to the outputs of two subencoders that are adjacent to each other in terms of the second suffix of the symbol "41" among the closest upstream subencoders. The subencoders 41-21 to 41-2(n/2), . . . , 41-k1 have the same configuration as the subencoders 41-11 to 41-1n.

The operation of the first embodiment of the invention will be described below with reference to FIG. 2.

All the contents of the information storage parts 61-1 to 61-N and the priority storage parts 31-1 to 31-N are initialized in a process of starting an apparatus that is provided with a CAM according to this embodiment. In the following description, it is assumed that the logical value of each of the validity bits V-1 to V-N is set to "1" only during a period when valid information is stored in both of the corresponding storage area and the corresponding priority storage part.

Pieces of information D-1 to D-N and priority ranks P-1 to P-N are registered in the information storage parts 61-1 to 61-N and in the priority storage parts 31-1 to 31-N respectively in the following manner. In the following description, an item common to the information storage parts 61-1 to 61-N and an item common to the priority storage parts 31-1 to 31-N will be described by using a suffix "C" meaning that it may be any of suffixes "1" to "N".

The decoder 20 performs the following processing in a period when an instruction I (="insert") meaning "writing" is supplied externally:

Decodes an address A-C that is input together with the instruction I, and selects only a single entry block 30-C corresponding to the address A-C from the entry blocks 30-1 to 30-N.

Writes a validity bit V-C having a logical value "1" and externally supplied information D-C to the information storage part 61-C, in synchronism with a control signal I/D indicating an instance at which data is written and being supplied along with the instruction I and the address A-C at an instant when a setup time of the information D-C and a priority rank P-C has been secured, and writes the priority rank P-C to the priority storage part 31-C in parallel.

In the following description, for the sake of simplicity, it is assumed that the priority ranks P-1 to P-N are unique binary numbers that are assigned in descending order of the priority ranks irrespective of which one of priority storage parts (the priority storage parts 31-1 to 31-N) to which they will be written and of order in which they will be written actually.

For example, valid information D-C and a valid priority rank P-C that have been written to the information storage part 61-C and the priority storage part 31-C, respectively, are deleted in the same manner as nullification processing in the conventional example that the logical value of the validity bit V-C that is registered in the information storage part 61-C s updated to "0".

To obtain an address (associative address) of one of the storage areas in the storage parts 61-1 to 61-N, which stores equivalent information to an externally supplied search key K, for example, a search is performed in the following manner.

During a period when an instruction I (="search") meaning "search" is supplied from the exterior, the decoder 20 supplies a search key K input externally in parallel with the instruction I to all of the entry blocks 30-1 to 30-N.

In the entry block 30-C, the AND gate 62-C allows the comparator 63-C to operate only during a period where the instruction I (=search) is supplied and the logical value of the validity bit V-C stored in the information storage part 61-C is equal to "1".

While being allowed to operate, the comparator 63-C EXCLUSIVE-ORs the information D-C, which is stored in the information storage part 61-C together with the validity bit V-C (="1"), with the search key K supplied from the decoder 20, and outputs binary information (for the sake of simplicity, it is assumed that its logical value is set to "1" only if the judgment result is "true") indicating whether all of the bits of the EXCLUSIVE-OR result have a logical value "0".

While the comparator 63-C outputs the above binary information, the priority storage part 31-C outputs the priority rank P-C stored in the priority storage part 31-C in parallel with the outputting.

In the priority encoder 40, each of the subencoders 41-11 to 41-1n, 41-21 to 41-2(n/2), . . . , 41-k1 performs the following processing. In the following description, an item common to the subencoders 41-11 to 41-1n, 41-21 to 41-2 (n/2), . . . , 41-k1 will be described by using, in place of one or both of the first and second suffixes of the symbol "41", a suffix "i" and a suffix "j", respectively, meaning that the item is applicable to any one of the subencoders 41-11 to 41-1n, 41-21 to 41-2(n/2), . . . , 41-k1.

A subencoder 41-1j disposed at the first stage (j=1 to n) performs the following processing in accordance with a combination of the logical values of pieces of binary information that are supplied in parallel from two upstream comparators 63-(2i−1) and 63-(2i):

(a) Delivers the following information to the downstream subencoder if both of the logical values of the pieces of binary information are "0":
A logical value (=0) at the comparison result output
A value (=0) at the priority output
A value (=0) at the cascade output (b) Delivers the following information to the downstream subencoder if the logical value of only the binary information supplied from the upstream converter 63-(2i−1) is "1":
A logical value (=1) at the comparison result output
A value (=(a priority rank that is output from the priority storage part 63-(2i−1))) at the priority output
A value (=0) at the cascade output (c) Delivers the following information to the downstream subencoder if the logical value of only the binary information supplied from the upstream converter 63-(2i) is "1":

A logical value (=1) at the comparison result output.
A value (=(a priority rank that is output from the priority storage part 63-(2i))) at the priority output.
A value (=1) at the cascade output.

(d) Delivers the following information to the downstream subencoder if both of the logical values of the pieces of binary information are "1":
A logical value (=1) at the comparison result output.
A value (=(a higher one of the priority ranks that are output from the priority storage parts 63-(2i−1) and 63-(2i))) at the priority output.
A value (=1(if the priority storage part 63-(2i) outputs a higher priority rank) or 0 (if the priority storage part 63-(2i−1) outputs a higher priority rank)) at the cascade output.

A subencoder 41-ij at the second or later stage (i≧2) performs the following processing in accordance with a combination of the logical values of pieces of binary information that are supplied in parallel from two upstream subencoders 41-(i−1)(2j−1) and 41-(i−1)(2j):

(a) Delivers the following information to the downstream subencoder or outputs the following information if both of the logical values of the pieces of binary information are "0":
A logical value (=0) at the comparison result output.
A value (=0) at the priority output.
A value (=(a word obtained by adding (packing), as the LSB, one bit having a logical value "0" to the value at the cascade output of the upstream subencoder 41-(i−1)(2j−1))) at the cascade output.

(b) Delivers the following information to the downstream subencoder or outputs the following information if the logical value of only the binary information supplied from the upstream subencoder 41-(i−1)(2j−1) is "1":
A logical value (=1) at the comparison result output.
A value (=(a priority rank that is output from the upstream subencoder 41-(i−1)(2j−1))) at the priority output.
A value (=(a word obtained by adding (packing), as the LSB, one bit having a logical value "0" to the value at the cascade output of the upstream subencoder 41-(i−1)(2j−1))) at the cascade output.

(c) Delivers the following information to the downstream subencoder or outputs the following information if the logical value of only the binary information supplied from the upstream subencoder 41-(i−1)(2j) is "1":
A logical value (=1) at the comparison result output.
A value (=(a priority rank that is output from the upstream subencoder 41-(i−1)(2j))) at the priority output.
A value (=(a word obtained by adding (packing), as the LSB, one bit having a logical value "1" to the value at the cascade output of the upstream subencoder 41-(i−1)(2j))) at the cascade output.

(d) Delivers the following information to the downstream subencoder or outputs the following information if both of the logical values of the pieces of binary information are "1":
A logical value (=1) at the comparison result output.
A value (=(a higher one of the priority ranks that are output from the priority storage parts 63-(2i−1) and 63-(2i))) at the priority output.
A value (=1(if the priority storage part 63-(2i) outputs a higher priority rank) or 0 (if the priority storage part 63-(2i−1) outputs a higher priority rank)) at the cascade output.

That is, the following information appears at the outputs of the priority encoder 40 (i.e., the subencoder 41-k1) as a result of the cooperation among the subencoders 41-11 to 41-1n, 41-21 to 41-2(n/2), ..., 41-k1:

Hit information that is binary information indicating whether there exists, in the information storage parts 61-1 to 61-N, an information storage part(s) where search subject information that is the same as the externally supplied search key K is stored together with the validity bit V having a logical value "1".

Priority information that is stored in one of priority storage parts corresponding to the above information storage parts and that has a highest priority rank.

An associative address that is a unique address of the information storage part corresponding to the priority storage part in which the above priority information is stored.

As described above, according to this embodiment, even if plural pieces of search subject information match a search key K among pieces of search subject information stored in the information storage parts 61-1 to 61-N together with respective validity bits V having a logical value "1", an address of the storage area with a highest priority rank which is stored among priority storage parts corresponding to the respective information storage parts where those plural pieces of search subject information are stored is output as an associative address.

Priority ranks to be stored in the priority storage parts 31-1 to 31-N can freely be set externally irrespective of addresses of the priority storage parts 31-1 to 31-N and order in which the priority ranks are stored.

Accordingly, the invention is very adaptable to a variety of forms of communication protocols, communication controls, and communication services.

A second embodiment of the invention will be described below.

In this embodiment, a decoder 20A that is different from the decoder 20 of the first embodiment in that the former is not provided with the priority input Pin and incorporates a counter (not shown) is provided in place of the decoder 20.

The operation of the second embodiment of the invention will be described below with reference to FIG. 2.

An important feature of this embodiment is the following procedure of processing that is performed by the decoder 20A in a process that pieces of information D-1 to D-N and priority ranks P-1 to P-N are registered in the information storage parts 61-1 to 61-N and the priority storage parts 31-1 to 31-N, respectively.

The decoder 20A initializes the above-mentioned counter in response to an instruction that is supplied externally (e.g., a registration start signal that is supplied externally via a dedicated terminal), and sets the count of the counter to "0".

Further, the decoder 20A performs the following processing in a period when an instruction I (=insert) meaning "writing" is supplied externally:

Decodes an address A-C that is input together with the instruction I, and selects only a single entry block 30-C corresponding to the address A-C among the entry blocks 30-1 to 30-N.

Writes, to the information storage part 61-C, a validity bit V-C having a logical value "1" and externally supplied information D-C in synchronism with a control signal I/D that is supplied along with the instruction I and the address A-C at an instant when a setup time relating to the information D-C has been secured and that indicates an instant at which data is written, and writes the count that is held in the counter (meaning a priority rank that replaces a priority rank P-C that is supplied externally in the first embodiment) to the priority storage part 31-C in parallel with the above writing.

That is, although the priority input Pin is not provided, the priority rank P-C of the information D-C stored in the information storage part 61-C is automatically set to a unique value that is assigned according to order in which pieces of information are stored (registered) in the respective information storage parts 61-1 to 61-N.

Therefore, according to this embodiment, as long as no limitations are imposed on the order in which pieces of information are stored (registered) in the respective information storage parts 61-1 to 61-N, it is possible to reducer the number of the signal wires used for receiving priority ranks from the outside without impairing the performance of the content-addressable memory, and to decide not only the pin arrangement but also the circuit layout and the mounting of parts on a chip or a circuit board more freely.

A third embodiment of the invention will be described below.

In this embodiment, a decoder 20B is provided instead of the decoder 20 of the first embodiment as an input port that is a combination of signal wires used for delivery of a prescribed sync signal and a serial bit string (or word sequence) that is synchronized with the sync signal. The decoder 20B is composed of all or part of the data input Din, the address input Ain, the search key input Kin, and the priority input Pin.

The operation of the third embodiment of the invention will be described below with reference to FIG. 2.

Among information D, addresses A, search keys K, and priority ranks P input via the data input Din, the address input Ain, the search key input Kin, and the priority input Pin, respectively, the decoder 20B performs serial-to-parallel conversion as appropriate on ones input serially via the above-mentioned input port, and distributes them to the entry blocks 30-1 to 30-N.

According to this embodiment, therefore, as long as a decrease in responsibility due to the serial input of part of information D, an address A, a search key K, and a priority rank P is within an allowable range, it is possible to simplify wiring used for interfacing with the outside and the pin assignment without lowering its total performance of the content-addressable memory, and to more freely mount parts in a package (module) or an apparatus to which the invention is applied, compared to a case where all of information D, an address A, a search key K, and a priority rank P are input in parallel.

Although this embodiment is based on the first embodiment, the invention is not limited to such a case. For example, this embodiment may be based on the second embodiment.

A fourth embodiment of the invention will be described below.

As indicated by broken lines in FIG. 2, this embodiment has the following features:

The entry block 30-C is provided with a temporary priority storage part 32-C in addition to the priority storage part 31-C.

The priority output Pout of the decoder 20, 20A, or 20B is not connected to the write ports of the priority storage parts 31-1 to 31-N.

A priority converting part 33 is provided that is connected to the priority output Pout, the insert output INSout, the delete output DELout of the decoder 20, 20A, or 20B and write ports and the read ports of the priority storage parts 31-1 to 31-N and the temporary priority storage parts 32-1 to 32-N.

The operation of the fourth embodiment of the invention will be described below with reference to FIG. 2.

An important feature of this embodiment is the following procedure of processing that is performed by the priority converting part 33 on the basis of a priority rank P-C that is input externally.

The decoder 20, 20A, or 20B performs the following processing in a period when an instruction I (="insert") meaning "writing" is supplied externally:

Decodes an address A-C that is input together with the instruction I, and selects only a single entry block 30-C corresponding to the address A-C among the entry blocks 30-1 to 30-N.

Writes a validity bit V-C having a logical value "1" and externally supplied information D-C to the information storage part 61-C, in synchronism with a control signal I/D indicating an instance at which data is written and being supplied along with the instruction I and the address A-C at an instant when a setup time of the information D-C and a priority rank P-C has been secured, and delivers the priority rank P-C to the priority converting part 33 in parallel.

It is assumed that priority ranks P-C satisfy the following conditions:

Comply with a network structure, a communication protocol employed, a communication control to be realized, and a switching form.

May have redundant values.

Their contents, formats, and order of supply each comply with a form of processing that is performed by the priority converting part 33 in the following manner.

On the other hand, the priority converting part 33 distributes the delivered priority ranks P-C to the temporary priority storage parts 32-C.

The temporary priority storage part of the selected entry block among the temporary priority storage parts 32-1 to 32-N holds the priority rank P-C thus delivered.

Recognizing cancellation of the above-mentioned instruction I (=insert) meaning "writing", the priority converting part 33 performs the following processing for each of priority ranks P-1 to P-N that are stored in the respective temporary priority storage parts 32-1 to 32-N only in a period when neither the instruction I (=insert) nor an instruction (=delete; described above) meaning "deletion" is supplied externally:

Converts the priority rank P-C into a unique priority rank PU-C according to a prescribed algorithm.

Stores the priority rank PU-C in the priority storage part 31-C.

That is, externally supplied priority ranks P-1 to P-N are converted into unique priority ranks PU-1 to PU-N as long as they comply with the procedure and the algorithm of the processing performed by the priority converting part 33 irrespective of the above-mentioned network structure, communication protocol, communication control, and switching form.

According to this embodiment, the content-addressable memory is made adaptable to a variety of network structures, communication protocols, communication controls, and forms of switches and modifications to the forms.

A fifth embodiment of the invention will be described below.

In this embodiment, as indicated by a two-dot chain line in FIG. 2, the highest-order outputs of the priority storage parts 31-1 to 31-N are connected to control terminals of the comparators 63-1 to 63-N.

The operation of the fifth embodiment of the invention will be described below with reference to FIG. 2.

In addition to a priority rank P-C (mentioned above), a control word CW-C that is added (packed) to the priority rank P-C at a higher-order position is input to the priority input Pin of the decoder 20.

The decoder 20 stores the priority rank P-C and the control word CW-C in the priority storage part 31-C, and the priority storage part 31-C supplies the control word CW-C to the comparator 63-C.

On the other hand, the comparator 63-C performs processing that is different than in the first embodiment in the following point. During a period when its operation is permitted by the AND gate 62-C in the above-described manner, the comparator 63-C compares, in a form indicated by the control word CW-C, the information D-C that is stored in the information storage part 61-C together with the validity bit V-C (=1) with a search key K that is supplied from the decoder 20 and outputs binary information indicating a result of a judgment as to whether all bits (comparison results) have a logical value "0".

That is, the effective search subject information stored in the information storage part 61-C and a search key K-C input externally in correlation with the search subject information are compared in the form (e.g., a combination of bits for comparison is determined according to a prescribed comparison criterion) indicated by the control word CW-C that is supplied externally together with the search key K-C.

As described above, according to this embodiment, search subject information and a search key are compared in a process of acquiring an associative address in various manners which will be specified externally.

Therefore, this embodiment is very adaptable to a variety of network structures, communication protocols, communication controls, and communication service requests.

In this embodiment, only a form of comparison between search subject information and a search key is selected according to a control word CW-C.

However, the invention is not limited to such a configuration. For example, all or part of the following items may be specified externally by forming control words CW-1 to CW-N as shown in FIG. 3 and distributing those to the priority encoder 40 (subencoders 41-11 to 41-1n, 41-21 to 41-2(n/2), . . . , 41-k1):

The number of associative addresses to be output (or a maximum number of associative addresses that can be output in parallel) and a combination thereof.

A form and contents of associative addresses to be output.

A procedure of processing that should be performed in a process of generating associative addresses to be output.

An operation subject that should be referred to in the above processing.

In each of the above embodiments, a validity bit V-C and search subject information D-C are packed and stored in the information storage part 61-C and a unique priority rank P-C that is assigned to the validity bit V-C and the search subject information D-C is stored in the priority storage part 31-C disposed separately from the information storage part 61-C.

Figure 4:
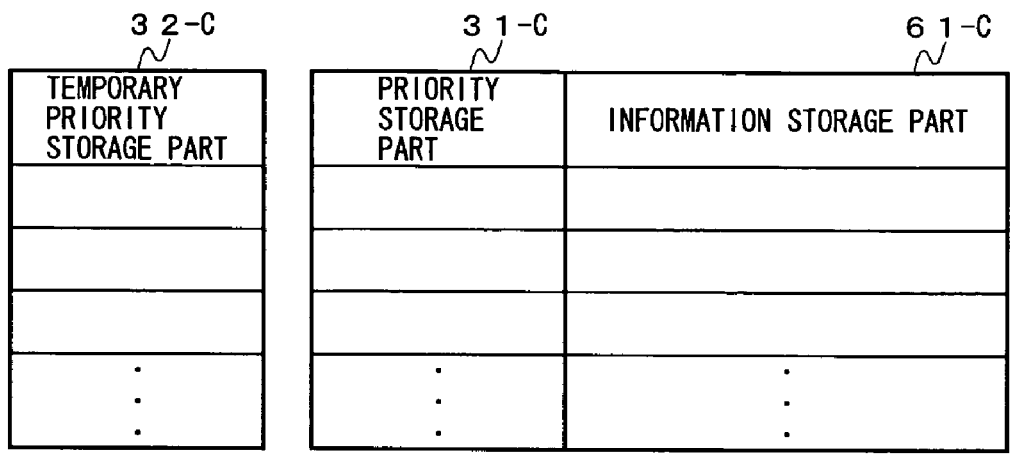
FIGS. 4A–4C show various forms of the structure of storage areas to be provided in an entry block.
Figure 4:
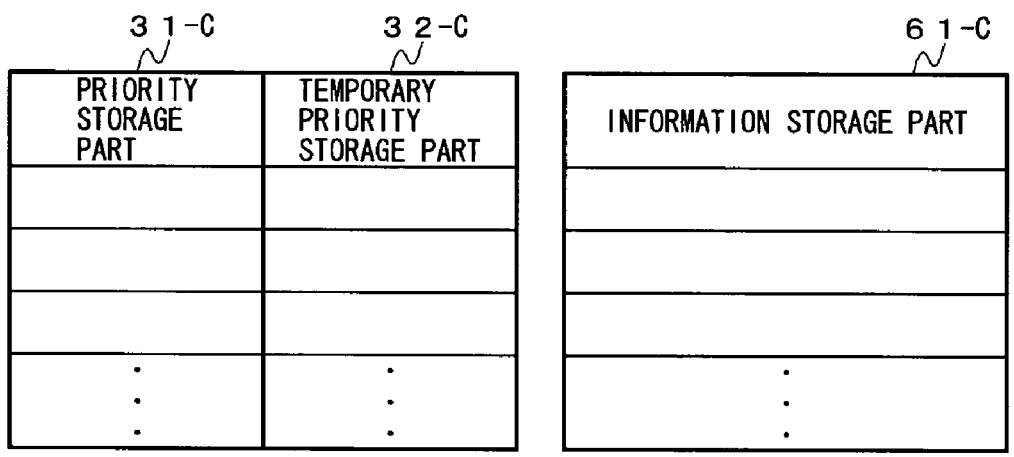
Figure 4:
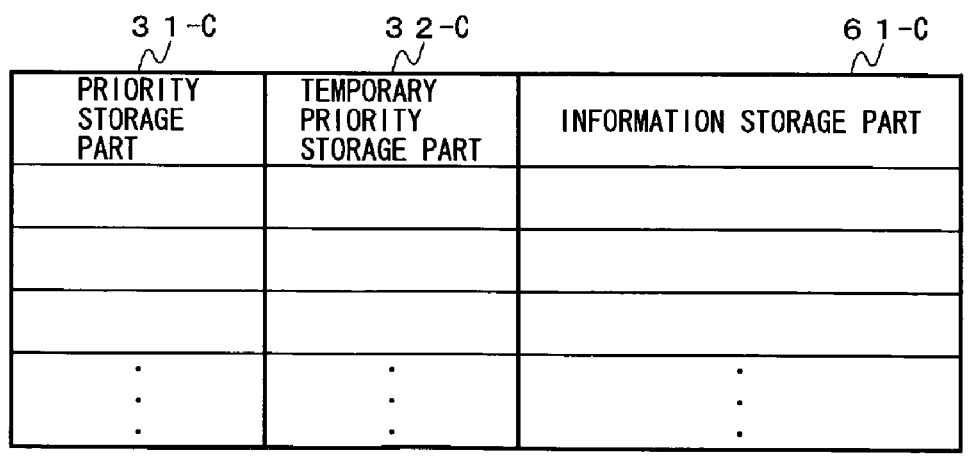

However, the invention is not limited to such a configuration. For example, the information storage part 61-C, the priority storage part 31-C, and the temporary priority storage part 32-C may have any of the following forms shown in FIGS. 4A–4C:

The information storage part 61-C and the priority storage part 31-C are combined together and the temporary priority storage part 32-C is formed as a memory separate from the information storage part 61-C and the priority storage part 31-C (see FIG. 4A).

The priority storage part 31-C and temporary priority storage part 32-C are combined together and the information storage part 61-C is formed as a memory separate from the priority storage part 31-C and temporary priority storage part 32-C (see FIG. 4B).

Both of the priority storage part 31-C and temporary priority storage part 32-C are combined with the information storage part 61-C (see FIG. 4C).

In each of the above embodiments, a validity bit V-C and search subject information D-C are stored in a pack as a single word in the information storage part 61-C having an address common thereto.

However, the invention is not limited to such a configuration. For example, validity bit V-C and search subject information D-C may be divided into pieces having a prescribed word length and written to a plurality of storage areas with a common address.

The invention is not limited to the above embodiments and various modifications may be made without departing from the spirit and scope of the invention. Any improvement may be made in part or all of the components.

What is claimed is:

1. A content-addressable memory comprising:
   a storage section having a plurality of storage areas for storing therein a plurality of pieces of information, the storage areas having respective priority ranks assigned thereto;
   an ancillary storage section having a plurality of ancillary storage areas for storing therein the priority ranks different from each other, the plurality of ancillary storage areas being associated with the plurality of storage areas, respectively, priority rank stored in each of the plurality of ancillary storage areas being assigned to the associated one of the plurality of storage areas; and
   a controlling section for outputting, when at least one of the storage areas stores therein information matching with a word supplied from an exterior, pointer(s) of all or part of the at least one of the storage areas in descending order of priority ranks that are stored in ancillary storage area(s) associated with the at least one of the storage areas.

2. The content-addressable memory according to claim 1, further comprising
   a priority setting section for creating sequential priority ranks in order in which the plurality of pieces of information are stored in the plurality of storage areas, and for storing the created priority ranks in ancillary storage areas associated with the storage areas, respectively.

3. The content-addressable memory according to claim 1, wherein
   the storage section is supplied in serial with the plurality of pieces of information from an exterior, and stores the supplied pieces of information in the plurality of storage areas in sequence.

4. The content-addressable memory according to claim 3, further comprising
   a priority converting section for converting the priority ranks stored in the ancillary storage areas into unique priority ranks indicating an order in which the plurality of pieces of information are to match with a common word supplied from an exterior.

5. The content-addressable memory according to claim 4, wherein:
   each of the priority ranks contains ancillary control information indicating a condition to be satisfied between the stored information in the plurality of storage areas and pointers of the storage areas; and
   the priority converting section converts each of the priority ranks stored in the ancillary storage areas into a priority rank which satisfies the condition contained in the ancillary control information.

6. The content-addressable memory according to claim 1, wherein
   the ancillary storage section is supplied in serial, from an exterior, with the priority ranks assigned to the storage areas, and stores the supplied priority ranks in the plurality of ancillary storage areas in sequence.

7. The content-addressable memory according to claim 6, further comprising
   a priority converting section for converting the priority ranks stored in the ancillary storage areas into unique priority ranks indicating an order in which the plurality of pieces of information are to match with a common word supplied from an exterior.

8. The content-addressable memory according to claim 7, wherein:
   each of the priority ranks contains ancillary control information indicating a condition to be satisfied between the stored information in the plurality of storage areas and pointers of the storage areas; and
   the priority converting section converts each of the priority ranks stored in the ancillary storage areas into a priority rank which satisfies the condition contained in the ancillary control information.

9. The content-addressable memory according to claim 1, further comprising
   a priority converting section for converting the priority ranks stored in the ancillary storage areas into unique priority ranks indicating an order in which the plurality of pieces of information are to match with a common word supplied from an exterior.

10. The content-addressable memory according to claim 9, wherein:
    each of the priority ranks contains ancillary control information indicating a condition to be satisfied between the stored information in the plurality of storage areas and pointers of the storage areas; and
    the priority converting section converts each of the priority ranks stored in the ancillary storage areas into a priority rank which satisfies the condition contained in the ancillary control information.

11. The content-addressable memory according to claim 1, wherein
    the plurality of storage areas and the plurality of ancillary storage areas are a set of common storage areas in each of which a single piece of information and a priority rank are stored in a pack, the single piece of information and the priority rank being associated with each other.

12. The content-addressable memory according to claim 11, wherein
    each of the common storage areas is a set of partial storage areas to which data is written individually.

13. The content-addressable memory according to claim 1, wherein:
    control information is appended to each of the priority ranks stored in the plurality of ancillary storage areas, the control information indicating a processing which the controlling section is to perform; and
    the controlling section determines which one of the ancillary storage areas is associated with one of the storage areas which stores therein information matching with the word supplied from an exterior, and performs a processing indicated by control information which is stored in the determined ancillary storage area.

14. The content-addressable memory according to claim 13, wherein
    the control information contains at least one of a criterion, the number of pointers to be output, and a type of the pointers, the criterion being for judging whether the stored information in the plurality of storage areas match with the word supplied front the exterior.

* * * * *